(12) United States Patent
Anderson et al.

(10) Patent No.: US 7,679,166 B2
(45) Date of Patent: Mar. 16, 2010

(54) LOCALIZED TEMPERATURE CONTROL DURING RAPID THERMAL ANNEAL

(75) Inventors: Brent A. Anderson, Jericho, VT (US); Edward J. Nowak, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 158 days.

(21) Appl. No.: 11/678,783

(22) Filed: Feb. 26, 2007

(65) Prior Publication Data

US 2008/0203523 A1 Aug. 28, 2008

(51) Int. Cl.
*H01L 29/12* (2006.01)
(52) U.S. Cl. .............. 257/638; 257/647; 257/E21.545; 257/E29.026
(58) Field of Classification Search .............. 257/506, 257/510, 513, 629, 638, 640, 647, 649, E21.54, 257/E21.545, E21.546, E29.026
See application file for complete search history.

(56) References Cited

U.S. PATENT DOCUMENTS

| 4,525,380 | A | 6/1985 | Arai et al. |
|---|---|---|---|
| 5,523,262 | A | 6/1996 | Fair et al. |
| H1637 | H | 3/1997 | Offord et al. |
| 5,841,110 | A | 11/1998 | Nenyei et al. |
| 5,897,381 | A | 4/1999 | Aronowitz et al. |
| 5,956,603 | A * | 9/1999 | Talwar et al. ............... 438/520 |
| 6,262,435 | B1 | 7/2001 | Plat et al. |
| 6,300,243 | B1 | 10/2001 | Thakur |
| 6,403,923 | B1 | 6/2002 | Tay et al. |
| 6,414,364 | B2 * | 7/2002 | Lane et al. ................... 257/397 |
| 6,569,720 | B2 | 5/2003 | Kunii |
| 6,665,858 | B2 * | 12/2003 | Miyazaki ..................... 430/319 |

(Continued)

FOREIGN PATENT DOCUMENTS

CN 1682358 A 10/2005

(Continued)

OTHER PUBLICATIONS

Laviron, et al., "Intra-Die Temperature Non Uniformity Related to Front Side Emissivity Dependence During Rapid Thermal Annealing," $203^{rd}$ ECS Meeting, Paris, Apr. 27-May 2, 2003, Paper#880, pp. 1-9.

(Continued)

*Primary Examiner*—Minh-Loan T Tran
*Assistant Examiner*—W. Wendy Kuo
(74) *Attorney, Agent, or Firm*—Gibb I.P. law Firm, LLC; Richard M. Kotulak, Esq

(57) ABSTRACT

Disclosed herein are embodiments of a semiconductor structure and an associated method of forming the semiconductor structure with shallow trench isolation structures having selectively adjusted reflectance and absorption characteristics in order to ensure uniform temperature changes across a wafer during a rapid thermal anneal and, thereby, limit variations in device performance. Also disclosed are embodiments of another semiconductor structure and an associated method of forming the semiconductor structure with devices having selectively adjusted reflectance and absorption characteristics in order to either selectively vary the performance of individual devices (e.g., to form devices with different threshold voltages (Vt) on the same wafer) and/or to selectively optimize the anneal temperature of individual devices (e.g., to ensure optimal activation temperatures for n-type and p-type dopants during anneals).

20 Claims, 8 Drawing Sheets

U.S. PATENT DOCUMENTS

| | | |
|---|---|---|
| 6,812,550 B1 | 11/2004 | En et al. |
| 6,867,080 B1 | 3/2005 | Paton et al. |
| 6,875,623 B2 | 4/2005 | Niwayama et al. |
| 6,916,690 B2 | 7/2005 | Chang |
| 7,344,929 B2 | 3/2008 | Mehrotra et al. |
| 2004/0033666 A1 | 2/2004 | Williams et al. |
| 2004/0077149 A1 | 4/2004 | Renau |
| 2004/0084427 A1 | 5/2004 | Talwar et al. |
| 2004/0188801 A1 | 9/2004 | Ehrichs |
| 2004/0195626 A1 | 10/2004 | Yamada et al. |
| 2004/0259387 A1 | 12/2004 | Yamazaki et al. |
| 2005/0003638 A1 | 1/2005 | Stolk |
| 2005/0009344 A1 | 1/2005 | Hwang et al. |
| 2005/0059224 A1 | 3/2005 | Im |
| 2005/0085047 A1 | 4/2005 | DeLoach et al. |
| 2005/0173802 A1 | 8/2005 | Tabara et al. |
| 2005/0189340 A1 | 9/2005 | Talwar et al. |
| 2005/0191044 A1 | 9/2005 | Aderhold et al. |
| 2006/0099745 A1 | 5/2006 | Hsu et al. |
| 2006/0154475 A1 | 7/2006 | Mehrotra et al. |
| 2006/0228897 A1 * | 10/2006 | Timans .................. 438/758 |

FOREIGN PATENT DOCUMENTS

| | | |
|---|---|---|
| DE | 10329212 | 1/2005 |
| JP | 06-295923 | 10/1994 |
| RU | 2 206 141 C1 | 6/2003 |
| WO | WO 93/19484 | 9/1993 |
| WO | 2007038575 | 4/2007 |

OTHER PUBLICATIONS

Anderson et al. U.S. Appl. No. 11/678,799, Office Action Communication, Apr. 15, 2009, 19 Pages.

Anderson et al., U.S. Appl. No. 11/678,745, Office Action Communication, May 13, 2009, 19 pages.

Anderson et al., U.S. Appl. No. 11/869,768, Office Action Communication, May 14, 2009, 26 pages.

Anderson et al., U.S. Appl. No. 11/678,756, Office Action Communication, Aug. 31, 2009, 6 pages.

PCT International Search Report and Written Opinion dated Aug. 27, 2009, pp. 1-12.

* cited by examiner

LOCALIZED TEMPERATURE CONTROL DURING RAPID THERMAL ANNEAL

BACKGROUND

1. Field of the Invention

The embodiments of the invention generally relate to semiconductor wafers and, more particularly, to semiconductor wafer structures and methods of forming the structures that balance variations in reflectance and absorption characteristics.

2. Description of the Related Art

Semiconductor wafer fabrication often involves the use of a rapid thermal anneal (RTA) process to affect the electrical properties of active devices on the wafer. More specifically, an RTA process can be used to activate dopants, diffuse dopants, re-amorphize structures, repair damage from ion implantation processes, etc. RTAs are typically performed by powerful halogen lamp-based heating equipment or lasers which direct radiation onto a wafer surface in order to change the wafer temperature. However, variations in the reflectance and absorption in different regions of a wafer, e.g., due to different materials and/or different thicknesses of materials, can result in non-uniform temperature changes across the wafer. These non-uniform temperature changes can result in temperature variations on the wafer of 10° C. or more.

Variations in reflectance and absorption characteristics can be caused by a variety of different factors including, different materials, the patterns of those materials in different regions of a wafer and the thicknesses of those materials in different regions of the wafer. For example, dielectric materials (e.g., silicon dioxide ($SiO_2$)) in shallow trench isolation structures have different reflectance and absorption characteristics than semiconductor materials (e.g., silicon or silicon germanium) incorporated into devices. Dense regions of a wafer (i.e., regions of a wafer having a high number of devices) will have a higher silicon to silicon dioxide ratio than less dense regions. Different silicon-to-silicon dioxide ratios in different regions of the wafer will result in non-uniform temperature changes during a RTA. These non-uniform temperature changes can cause variations in dopant activation, damage repair, etc. across the wafer and can, thereby, cause variations in threshold voltages, sheet resistances, drive currents, leakage currents, etc. between devices on different regions of the wafer. Thus, non-uniform temperature changes can cause significant, location-dependent, variations in device performance.

Furthermore, as technologies continue to scale, anneal ramp times will continue to decrease (e.g., to sub-second ramps) and these faster ramp times will be accompanied by an even greater sensitivity to variations in reflectance and absorption characteristics across a wafer.

SUMMARY

Disclosed herein are embodiments of a first semiconductor structure and method of forming the structure with isolation regions having selectively adjusted reflectance and absorption characteristics in order to ensure uniform temperature changes during a rapid thermal anneal and, thereby, limit variations in device performance.

More specifically, embodiments of the first semiconductor structure can comprise both a device and a shallow trench isolation region above the substrate of either a bulk silicon or silicon-on-insulator (SOI) wafer. The device can comprise a semiconductor region comprising source/drain regions and a channel region disposed between the source/drain regions. The source/drain regions can comprise a first material (e.g., silicon or silicon germanium) with a first reflectivity. The shallow trench isolation region can comprise a second material (e.g., an insulator, such as, silicon dioxide ($SiO_2$)) with a second reflectivity. The isolation region can also comprise a third material that is pre-selected (e.g., a different insulator than the second material, such as a nitride or a spin-on dielectric material, silicon, silicon germanium, etc.) and is present in the isolation region at a predetermined ratio and at a predetermined location relative to the second material in order balance reflectivity (i.e., to eliminate or minimize reflectivity differences) between the first and second materials. Thus, the third material ensure that the reflectance and absorption characteristics of both the device and isolation regions are approximately uniform.

For example, the second material can fill the trench of a shallow trench isolation structure and the top surfaces of the first material of the device and the second material of the STI can be level. The third material can be completely embedded within the second material in the trench, partially embedded within the second material or positioned entirely above the second material. If the third material comprises an insulator that is different from the second material then, it may also be layered on the substrate within the trench below the second material.

Embodiments of the method of forming the first semiconductor structure, described above, can comprise providing a semiconductor wafer and selecting the materials that will be used to form the device and shallow trench isolation region. That is, the first material that will be used in the source/drain regions of the device and the second material that will primarily fill the adjacent STI can be selected. For example, silicon can be selected for the source/drain regions of nFETs and silicon or silicon germanium can be selected for the source/drain regions of pFETs. An insulator can be selected for the STI fill material. The reflectivities of the first and second materials (i.e., the first and second reflectivity, respectively) can then be determined and compared.

Based on the differences between the first and second reflectivities, a third material can be selected for incorporation into the shallow trench isolation structure. The selected third material can be a different insulator (e.g., a nitride or spin-on dielectric material), silicon, silicon germanium, etc. Additionally, the optimal ratio and location of the third material relative to the second material in the isolation region (e.g., above, below, embedded within, etc.) that will balance the different reflectance characteristics of the device and STI can be determined. Thus, the third material will eliminate or minimize the differences reflectivity differences between the device and STI regions to make the reflectance and absorption characteristics across the wafer approximately uniform.

The device and STI can then be formed on the wafer, according to the above-described selections and determinations, using conventional processing techniques. That is, the device with the pre-selected first material and the trench isolation region with the pre-selected second and third materials are formed on the wafer. Different techniques may be used to form the trench isolation region so that the third material is incorporated into the isolation region at the desired ratio and location relative to the second material.

For example, in order to position the third material above the second material or to partially or completely embed the third material within the second material, the trench is etched and the second material is deposited to fill the trench. Specifically, to position the third material above the second material, the second material is polished and the third material is deposited. The third material is then patterned so that it does not extend laterally beyond the edges of the second material. In order to completely or partially embed the third material within the second material, after the second material is deposited, a second trench is etched into the second material. Then, the third material is deposited to fill the second trench. To completely embed the third material within the second material, the third material is recessed and the second material is again deposited to fill the remainder of the second trench. To only partially embed the third material within the second material, after third material is deposited, it is patterned so that a top portion of the third material extends vertically above the second material, but not laterally beyond the edges of the second material. Alternatively, if a second insulator (e.g., a nitride, such as, SiN, or a spin-on dielectric material) is selected as the third material, the third material can be positioned directly on the substrate below the second material. To accomplish this, after the trench is etched, the third material is deposited to fill the trench. The third material is then recessed and the second material is deposited to fill the remainder of the trench.

Disclosed are also embodiments of a second semiconductor structure and associated method of forming the structure with devices that have selectively adjusted reflectance and absorption characteristics in order to either selectively vary the performance of individual devices (e.g., to form devices with different threshold voltages (Vt) on the same wafer) and/or to selectively optimize the anneal temperature of individual devices (e.g., to ensure optimal activation temperatures for n-type and p-type dopants during anneals). That is, by selectively varying the reflectance and absorption characteristics in different regions of a wafer, different maximum temperatures can be achieved in the different regions (at the different devices) during a single rapid thermal anneal process, for example, in order to achieve optimum anneal temperatures for different devices during the RTA or in order to form devices with different threshold voltages as a result of the RTA.

Each of the embodiments of this second semiconductor structure can comprise at least two devices above the substrate of either a bulk silicon or silicon-on-insulator (SOI) wafer. These devices can be bordered by isolation regions.

One embodiment of the second semiconductor structure can further comprise a dielectric material (e.g., an oxide or a nitride) in pattern on the first device. The pattern can be located only above the first device or can overlap both the first device and the adjacent isolation regions. The density of this pattern (i.e., the relative amount of dielectric surface area to device surface area exposed) is predetermined in order to selectively adjust reflectivity of the first device. For example, the density of the pattern of dielectric material on the first device can be predetermined so as to selectively increase the reflectivity of the first device relative to the reflectivity of the second device and to, thereby, selectively increase a first threshold voltage of the first device relative to a second threshold voltage of the second device. Alternatively, if the first device comprises a p-type field effect transistor and the second device comprises an n-type field effect transistor, the density of the pattern of dielectric material on the first device can be predetermined in order to either optimize the anneal temperature of the p-type field effect transistor or to balance different reflectivities in the devices when they are formed with different semiconductor materials.

Another embodiment the second semiconductor structure can further comprise a dielectric material (e.g., an oxide or a nitride) in first pattern on the first device and also in a second pattern on the second device. Additionally, the first and second patterns can be located only above the first device and second devices, respectively, or can overlap the adjacent isolation regions. The densities of the patterns over the devices (i.e., the relative amount of dielectric surface area to device surface area exposed) can be different and can be predetermined in order to selectively adjust the reflectivities of the first and second devices. For example, the first density of the first pattern and the second density of the second pattern can each be predetermined in order to selectively and independently control the threshold voltages of the first and second devices. The first density of the first pattern and the second density of the second pattern can also be predetermined in order to selectively and independently optimize anneal temperatures of the first device and the second device.

Embodiments of the method of forming the second semiconductor structure, described above, can comprise first providing a semiconductor wafer.

Multiple devices (e.g., a first device and a second device) bordered by isolation regions (e.g., shallow trench isolation structures (STIs)) are formed on the wafer. Depending upon process steps used, the reflectivity of one or more of the devices (e.g., the first device and/or the second device) are selectively adjusted prior to or following device formation.

In order to selectively adjust reflectivity, a dielectric material (e.g., an oxide, such as, $SiO_2$, or a nitride, such as, SiN) is deposited over the devices (i.e., over the first and second devices). The dielectric material is then patterned to form a first pattern on the first device, optionally overlapping the adjacent isolation regions, and/or a second pattern on the second device, optionally overlapping the adjacent isolation regions. However, prior to the patterning process, the densities of the first and/or second patterns (i.e., the relative amount of dielectric surface area to device surface area exposed) are determined. For example, the first density of the first pattern and the second density of the second pattern can be predetermined in order to selectively optimize the anneal temperatures of the first and second devices, to selectively and independently control threshold voltages of the first and second devices or to balance reflectivity differences between different semiconductor materials in the first device and the second device.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
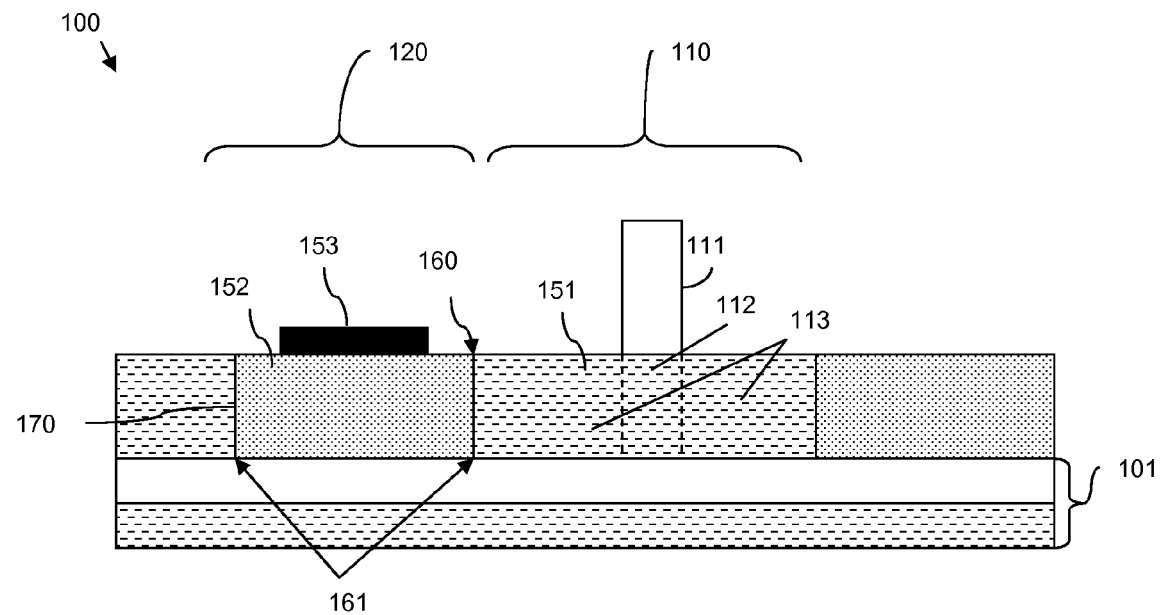
FIG. 1 is a schematic diagram illustrating a semiconductor structure of the invention.
Figure 2:
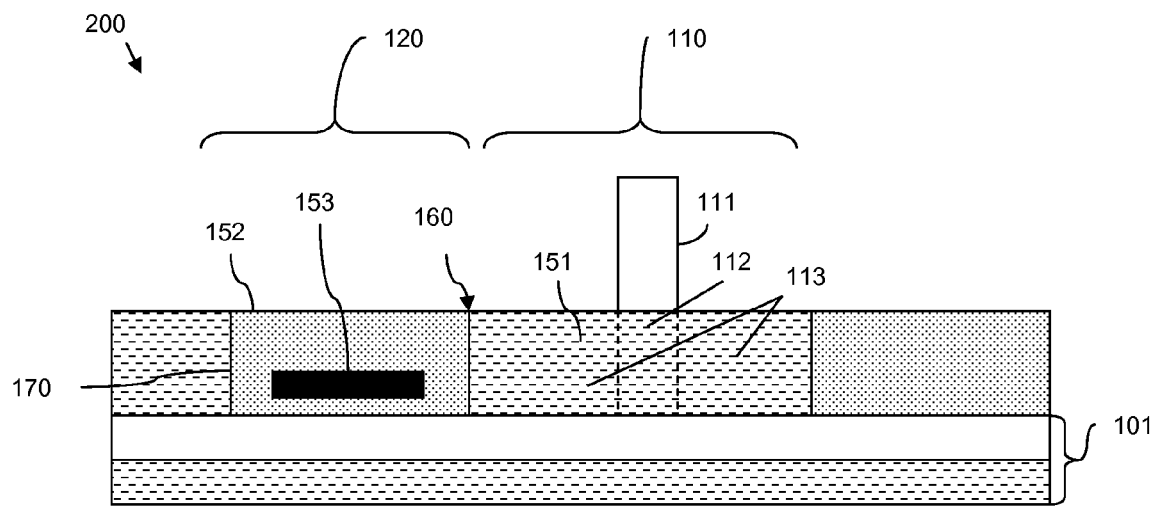
FIG. 2 is a schematic diagram illustrating an embodiment of the semiconductor structure of the invention.
Figure 3:
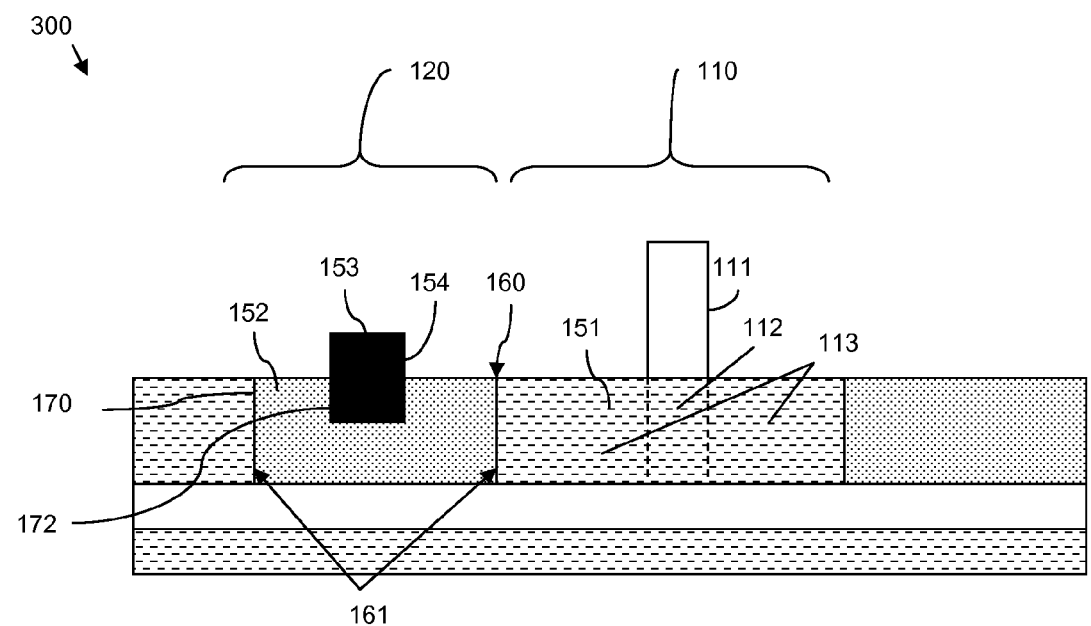
FIG. 3 is a schematic diagram illustrating an embodiment of the semiconductor structure of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, variations in reflectance and absorption characteristics can be caused by a variety of different factors including, different materials, the patterns of those materials in different regions of a wafer and the thicknesses of those materials in different regions of the wafer. For example, dielectric materials (e.g., silicon dioxide ($SiO_2$)) in shallow trench isolation structures have different reflectance and absorption characteristics than semiconductor materials (e.g., silicon or silicon germanium) incorporated into devices. These different reflectance characteristics can result in non-uniform temperature changes across the wafer during a rapid thermal anneal (RTA) process. Non-uniform temperature changes can cause variations in dopant activation, damage repair, etc. across the wafer and can, thereby, cause variations in threshold voltages, sheet resistances, drive currents, leakage currents, etc. between devices on different regions of the wafer. Thus, non-uniform temperature changes can cause significant, location-dependent, variations in device performance. It would be advantageous over the prior art to provide a wafer structure with uniform reflectance and absorption characteristics to ensure uniform temperature changes during a rapid thermal anneal and, thereby, limit variations in device performance. It would also be advantageous over the prior art to selectively vary the reflectance and absorption characteristics in different regions of a wafer in order to either selectively vary the performance of individual devices on the same wafer (e.g., to form devices with different threshold voltages (Vt) on the same wafer) and/or to selectively vary the anneal temperature of individual devices (e.g., to ensure optimal activation temperatures for n-type and p-type dopants during anneals).

In view of the foregoing, disclosed herein are embodiments of a semiconductor structure with shallow trench isolation structures having selectively adjusted reflectance and absorption characteristics in order to ensure uniform temperature changes across a wafer during a rapid thermal anneal and, thereby, limit variations in device performance. Also disclosed herein are embodiments of a semiconductor structure with devices having selectively adjusted reflectance and absorption characteristics in order to either selectively vary the performance of individual devices (e.g., to form devices with different threshold voltages (Vt) on the same wafer) and/or to selectively optimize the anneal temperature of individual devices (e.g., to ensure optimal activation temperatures for n-type and p-type dopants during anneals).

More specifically, disclosed herein are embodiments a first semiconductor structure (see structures 100-400 of FIGS. 1-4, respectively) and an associated method of forming the structure. The structure 100-400 comprises isolation regions (e.g., shallow trench isolation structures (STIs)) with selectively adjusted reflectance and absorption characteristics. Selectively adjusting the reflectance and absorption characteristics of the STIs ensures uniform temperature changes during a rapid thermal anneal and, thereby, limits variations threshold voltages between devices which result in variations in device performances.

Each of the embodiments of the first semiconductor structure 100-400 can comprise a device 110 and a shallow trench isolation region 120 above the substrate 101 of either a bulk silicon or silicon-on-insulator (SOI) wafer.

The device 110 (e.g., an n-type field effect transistor (nFET) or a p-type field effect transistor (pFET)) can comprise a semiconductor region and a gate 111 (e.g., a polysilicon gate conductor on a gate dielectric layer) above the semiconductor region. The semiconductor region can comprise source/drain regions 113 and a channel region 112 below the gate 111 and disposed between the source/drain regions 113. The source/drain regions 113 can comprise a first material 151 with a first reflectivity (e.g., silicon (Si) for nFETs; Si or epitaxially grown silicon germanium (eSiGe) for pFETs).

The shallow trench isolation region 120 can comprise a second material (e.g., an insulator, such as, silicon dioxide ($SiO_2$)). The isolation region 120 can also comprise a third material 153 that is pre-selected (e.g., an insulator that is different from the second material, silicon, silicon germanium, nitride, a spin-on material, etc.) and is present at a predetermined ratio and at a predetermined location in the isolation region relative to the second material 152 in order balance the first reflectivity of the first material 151 in the device 110 and the second reflectivity of the second material 152 in the STI 120 (i.e., to eliminate or minimize the reflectivity differences between the device and STI regions so as to ensure uniform reflectance and absorption characteristics across the wafer).

For example, the second material 152 can fill the shallow trench isolation structure 120 such that the top surfaces 160 of the first material 151 of the device 110 and the second material 152 of the STI 120 are level. The third material 153 can be completely embedded within the second material 152 in the trench 170 (see structure 200 of FIG. 2) or partially embedded within the second material 152 in the trench 170 such that a portion of the third material 153 extends vertically above top surface 160 of the second material 152, but does not extend laterally beyond the edges 161 of the second material (see structure 300 of FIG. 3). The third material 153 can also be positioned entirely above the second material 152 (see structure 100 of FIG. 1) and patterned, as with structure 200, so that it does not extend laterally beyond the edges 161 of the second material 152. Furthermore, if the third material 153 comprises a different insulator material than the second material 152 (e.g., a nitride or a spin-on dielectric material), it may be layered on the substrate 101 within the trench 170 below the second material 152 (see structure 400 of FIG. 4).

Figure 4:
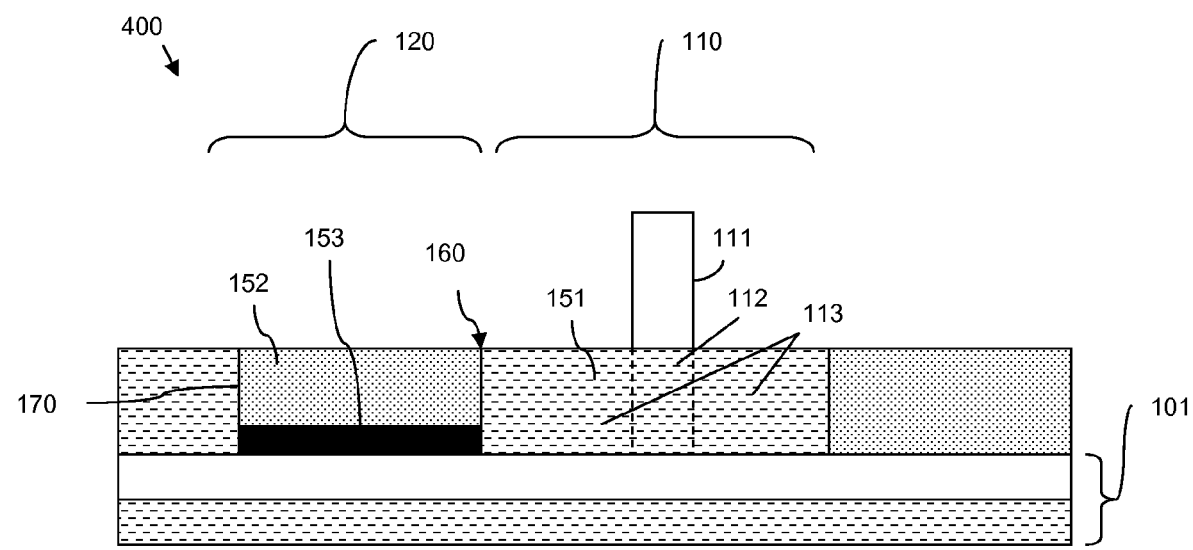
FIG. 4 is a schematic diagram illustrating an embodiment of the semiconductor structure of the invention.
Figure 5:
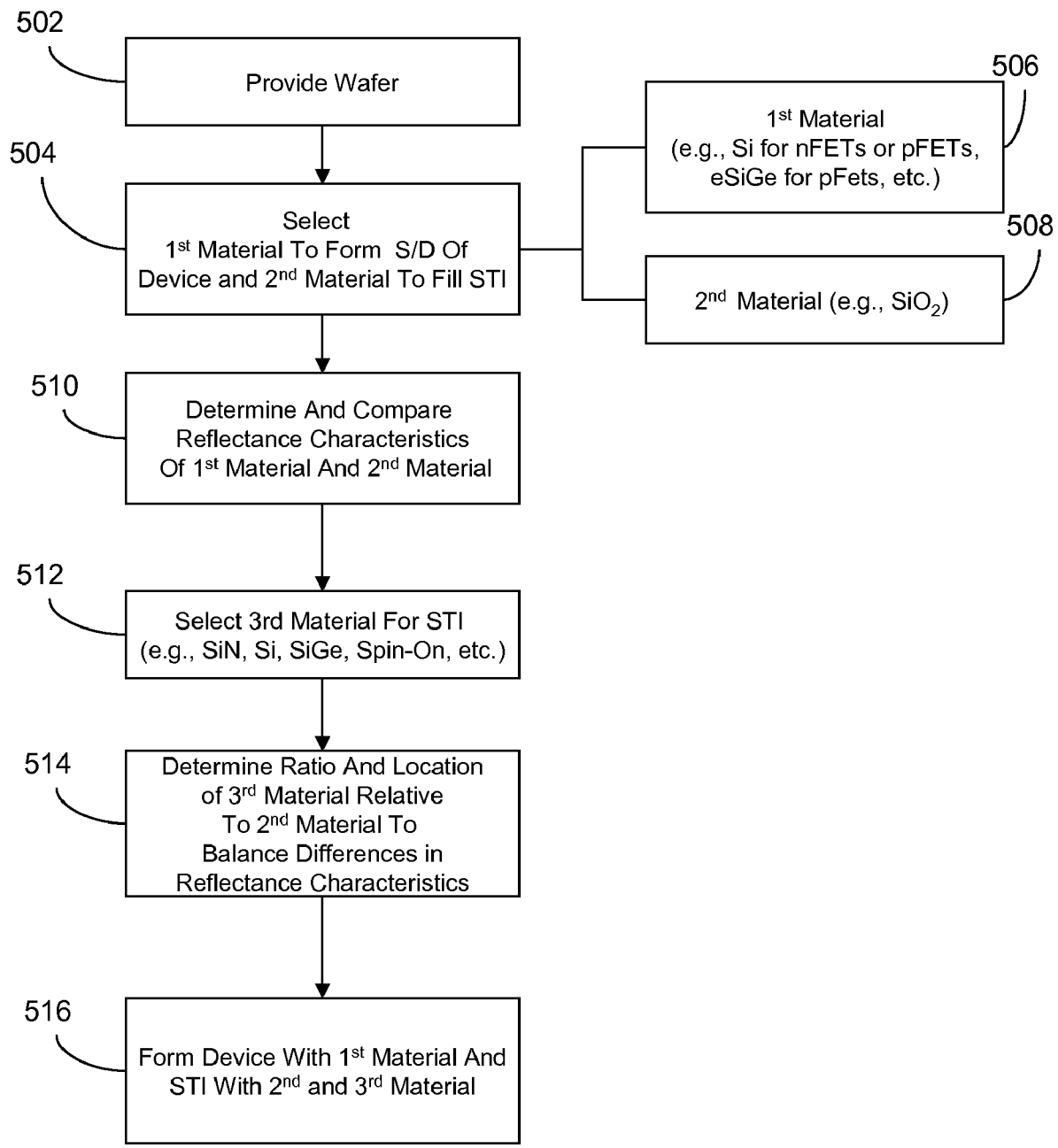
FIG. 5 is a flow diagram illustrating an embodiment of the method of forming the semiconductor structures of FIGS. 1-4.

Referring to FIG. 5 in combination with FIGS. 1-4, embodiments of the method of forming the semiconductor structures 100-400, described above, with an isolation region 120 (e.g., a shallow trench isolation structure (STI)) having selectively adjusted reflectance and absorption characteristics can comprise providing a semiconductor wafer (e.g., a bulk silicon wafer or a silicon-on-insulator (SOI) wafer) (502) and selecting the materials that will be used to form the device and the shallow trench isolation region (504).

Specifically, the first material 151 that will be used in the source/drain regions of the device (506) and the second material 152 that will primarily fill the adjacent isolation structure can be selected (508). For example, silicon can be selected for the source/drain regions of an nFET and silicon or silicon germanium can be selected for the source/drain regions of a pFET. An insulator (e.g., an oxide, such as, $SiO_2$) can be selected for the STI fill material. The reflectivities of the first and second materials (i.e., the first and second reflectivity, respectively) can then be determined and compared (510).

The reflectivity of a film is equal to a specific wavelength (e.g., the wavelength of light used during rapid thermal anneal) in a vacuum divided by the index of refraction of the material used to form the film or $\lambda_{film} = \lambda_{vacuum}/n_{film}$. Refraction is generally defined as the bending of a light wave when it enters a material where its speed is different and the index of refraction is generally defined as the speed of light in a vacuum divided by the speed of light in the particular material.

Those skilled in the art will generally recognize the following additional principles related to the reflectance and absorption characteristics of thin films. First, a light wave directed onto a structure with multiple layers of thin films will be at least partially reflected and transmitted at each interface between the layers and the sum of the reflected light waves from each of these interfaces can be calculated to determine the overall reflectivity of the multi-layered structure. Second, if a light wave passes through a first film layer and reflects from a second film layer with a larger index of refraction than the first film, then the phase shift of the reflected wave with respect to the incident light wave will be 180°. However, if a light wave passes through a first film layer and reflects from a second film layer with a smaller index of refraction, then the phase shift of the reflected wave with respect to the incident light wave will be zero. Finally, the incident light waves and the reflected light waves may interfere constructively or destructively (i.e., thin-film interference may occur).

With these principles in mind and based on the differences between the first and second reflectivities, a third material can be selected for incorporation into the shallow trench isolation structure (512). The selected third material can be a different insulator (e.g., a nitride), silicon, silicon germanium, a spin-on dielectric material, etc. Additionally, the optimal ratio and location of the third material relative to the second material in the isolation region (e.g., above, below, embedded within, etc.) can be determined so that the reflectance and absorption characteristics of the device and STI regions are approximately uniform (i.e., so that differences in the reflectivity between the regions is eliminated or minimized) (514). The third material is typically chosen to be a dielectric so that capacitance is kept low and shorting defects are prevented. The location of the third material is flexible and is primarily determined to minimize cost and integration difficulties. The thickness of the material must be chosen in relation to the thickness of the isolation so that the reflectance is different than STI regions that do not include the third material.

The device 110 and STI 120 can then be formed on the wafer, according to the above-described selections and determinations, using conventional processing techniques. That is, the device 110, having the pre-selected first material, and the trench isolation region 120, filled with the pre-selected second and third materials, are formed on the wafer (516).

Figure 6:
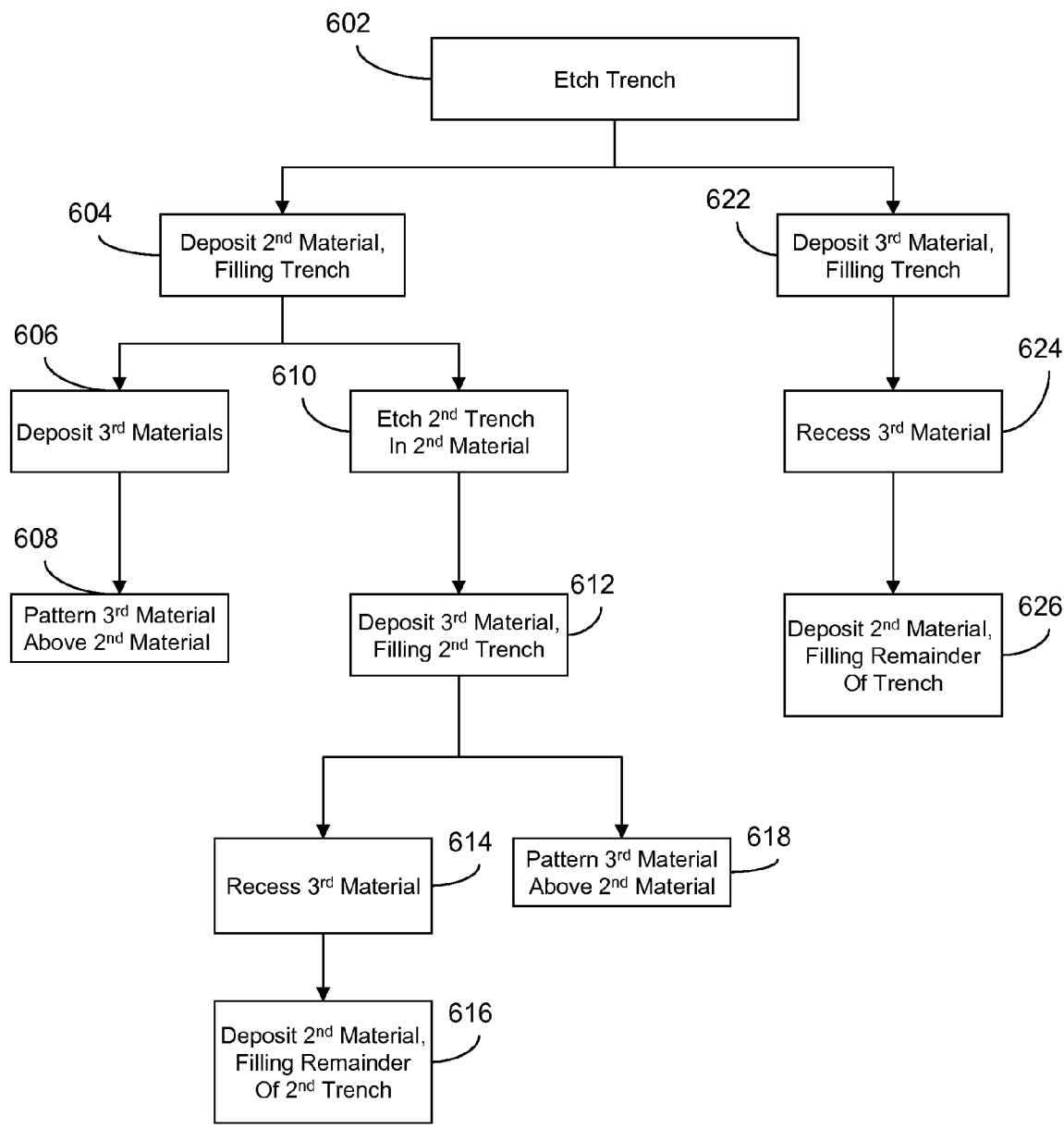
FIG. 6 is a flow diagram illustrating techniques which may be used to form the STI in method step 516 of FIG. 5.

Referring to FIG. 6, different techniques may be used to form the STI so that the third material 153 is incorporated into the isolation region 120 at the desired ratio and location relative to the second material 152 (as determined at process 512, discussed above).

For example, a trench can be etched through a semiconductor layer of the wafer (602). Then, in order to either position the third material above the second material or to partially or completely embed the third material within the second material, after the trench is etch at process 602, the second material is deposited to fill the trench (604).

In order to position the third material 153 entirely above the second material 152 (as in structure 100 of FIG. 1), after the second material is deposited at process 604, the second material 152 is polished and the third material 153 is deposited (606). The third material is then patterned (e.g., selectively etched using conventional lithographic techniques) above the second material 152 (608) so that it does not extend laterally beyond the edges 161 of the second material 152. A benefit of forming the third material 153 entirely above the second material is that the third material may be considered sacrificial. Thus, following a rapid thermal anneal (RTA), the third material can be removed and device processing can continue.

In order to completely or partially embed the third material 153 within the second material 152 (as in structures 200 and 300 of FIGS. 2 and 3, respectively), after the second material is deposited at process 604, a second trench 172 is formed (e.g., etched) into the second material 152 (610) and the third material 153 is deposited to fill the second trench 172 (612). To completely embed the third material 153 within the second material 152, after the third material is deposited at process 612, a top portion of the third material in the trench is removed (i.e., the third material in the trench is recessed) (614) and the second material 152 is again deposited to fill the remainder of the second trench 172 (616). Thus, in structure 200 of FIG. 2, the third material 153 is completely embedded within the second material 152. To partially embed the third material 153 within the second material 152, after the third material is deposited at process 612, it is patterned (e.g., selectively etched using conventional lithographic patterning techniques) so that a top portion of the third material extends vertically above the second material, but not laterally beyond the edges of the second material (618). Thus, in the structure 300 of FIG. 3, third material 153 is only partially embedded within the second material 152.

Alternatively, if a second insulator (e.g., a nitride, such as, SiN, or a spin-on dielectric material) is selected as the third material 153, the third material 153 can be positioned on the substrate 101 in the trench 170 below the second material 152 (see structure 400 of FIG. 4). To accomplish this, after the trench is etched at process 602, the third material 153 is deposited to fill the trench (622). Then, the top portion of the third material is removed (i.e., the third material is recessed) (624) and the second material 152 is deposited to fill the remainder of the trench (626). Thus, the third material 153 forms a first isolation layer and the second material 152 forms a second isolation layer in the shallow trench isolation structure 120.

Referring to FIGS. 7-12, also disclosed are embodiments of a semiconductor structure and associated method of forming the structure with one or more devices that have selectively adjusted reflectance and absorption characteristics in order to selectively vary the maximum temperature that is achieved by different regions of the structure (e.g., at different devices) during an RTA and, thereby, to either selectively vary the performance of individual devices (e.g., to form devices with different threshold voltages (Vt) on the same wafer) as a result of the RTA and/or to selectively optimize the anneal temperature of individual devices during the RTA (e.g., to ensure optimal activation temperatures for n-type and p-type dopants during anneals).

Figure 7:
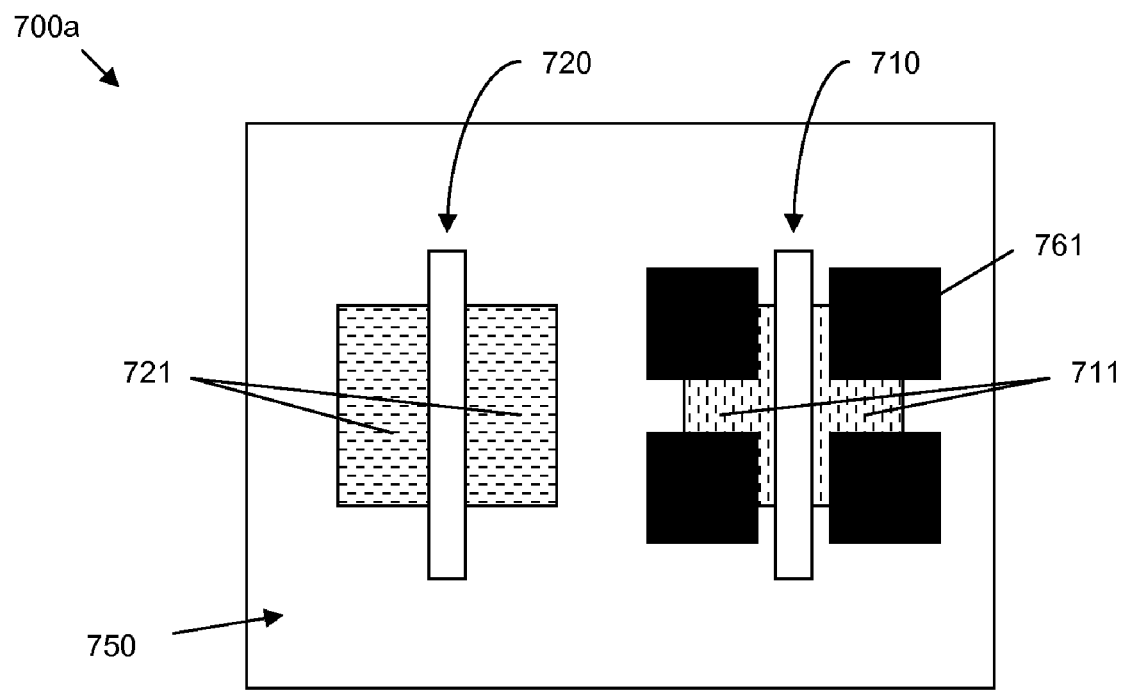
FIG. 7 is a schematic diagram illustrating an embodiment of another semiconductor structure of the invention.
Figure 8:
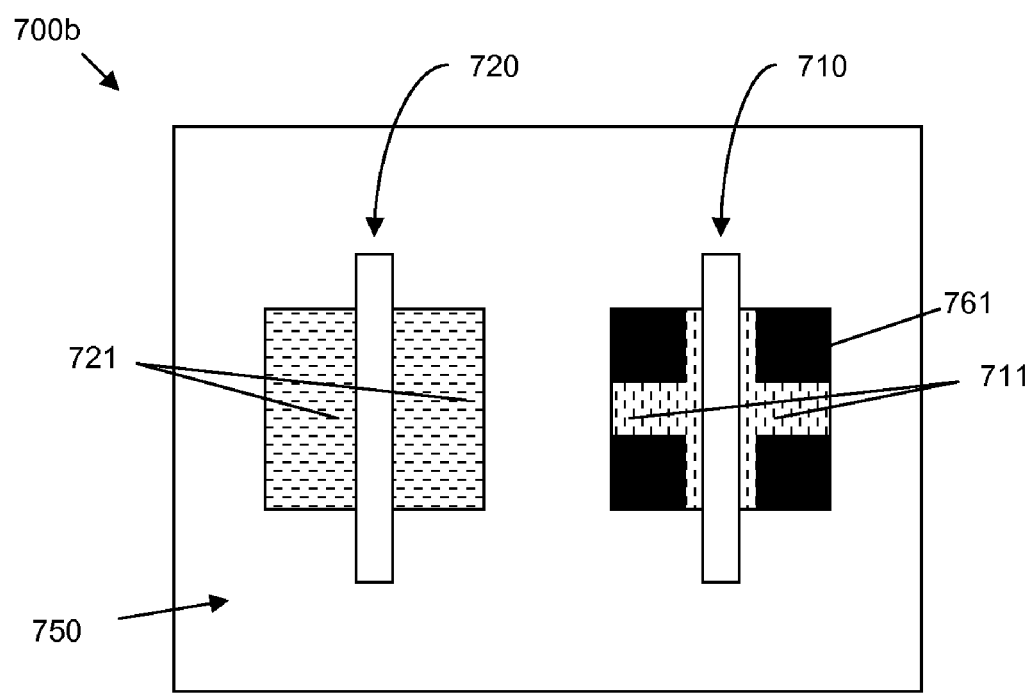
FIG. 8 is a schematic diagram illustrating an embodiment of the semiconductor structure of the invention.

More particularly, referring to FIGS. 7-8, one embodiment the semiconductor structure 700a-b can at least two devices (i.e., a first device 710 and a second device 720) above the substrate of either a bulk silicon or silicon-on-insulator (SOI) wafer. These devices 710, 720 can comprise n-type field effect transistors (nFETs) and/or p-type field effect transistors (pFETs) and can be bordered by isolation regions 750 (e.g., shallow trench isolation structures (STIs)).

The structure 700a-b can also comprise a dielectric material (e.g., an oxide or a nitride) in pattern 761 on the first device 710. The pattern 761 can be located only above the first device 710, as illustrated in structure 700b of FIG. 8, or can overlap both the first device 710 and the isolation region 750 bordering the first device 710, as illustrated in structure 700a of FIG. 7. The density of this pattern 761 above the first device 710 (i.e., the amount of the first device 710 covered by the dielectric material in the pattern 761) is predetermined in order to selectively adjust the overall reflectivity (i.e., the overall reflectance characteristics) of the first device 710. If more of the device 710 is covered by dielectric material, the reflectivity of the device 710 will increase and, thus, the device 710 will remain cooler during any subsequent rapid thermal anneal processes. Devices that remain cooler during anneal processes will have increased threshold voltages over other devices.

The density of the patterns of dielectric material on the first and second devices can be predetermined for a variety of reason. For example, the density of the pattern 761 of dielectric material on the first device 710 can be predetermined so that the reflectivity of the first device 710 (i.e., the first reflectivity) is selectively increased relative to the reflectivity of the second device 720 (i.e., the second reflectivity) and, thus, so that the first threshold voltage of the first device 710 is selectively increased relative to the second threshold voltage of the second device 720. The density of the pattern 761 may also be predetermined to either optimize the anneal temperature of the first device 761 or to balance differences in the reflectivities of the first and second devices 710, 720. Desired regional anneal temperatures are used to calculate the desired reflectivity in a region. This reflectivity is used to calculate the density of the patterned dielectric material. Specifically, the first device 710 might comprise a p-type field effect transistor and the second device 720 might comprise an n-type field effect transistor. The density of the pattern 761 of dielectric material on the first device 710 can be predetermined so that the anneal temperature of the p-type field effect transistor is optimized. That is, the optimal anneal temperature for activating p-type dopants (e.g., boron (B)) in pFETs is typically less than the optimal anneal temperature for activating n-type dopants (e.g., antimony (Sb), arsenic (As) and phosphorous (P)) in nFETs. By patterning the dielectric material over the pFET 710 and not the nFET 720, cooler anneal temperatures can be achieved for the pFET. Multiple device anneals can be done during device processing with a typical anneal temperature being greater than 1000 C. Alternatively, the devices 710 and 720 might comprise different materials with different reflectivities. The pattern 761 can be used to balance overall reflectivity differences in the devices 710, 720 resulting from those different materials and, thereby, to limit variations in device performance. For example, the first device 710 might comprise a pFET with epitaxially grown silicon germanium source/drain regions 711 and the second device 720 might comprise an nFET with silicon source/drain regions 721. Silicon has a greater reflectivity than silicon germanium. By patterning the dielectric material on the silicon germanium source/drain regions 711 of the first device 710, the overall reflectivity differences between the first and second devices 710, 720 can be balanced (i.e., minimized or eliminated).

The dielectric material must have a predetermined thickness that ensures a reflectance difference between the areas of the first device with and without the dielectric layer. Additionally, the thickness of the dielectric material can be predetermined in order to maximize the reflectance difference between these areas.

Figure 9:
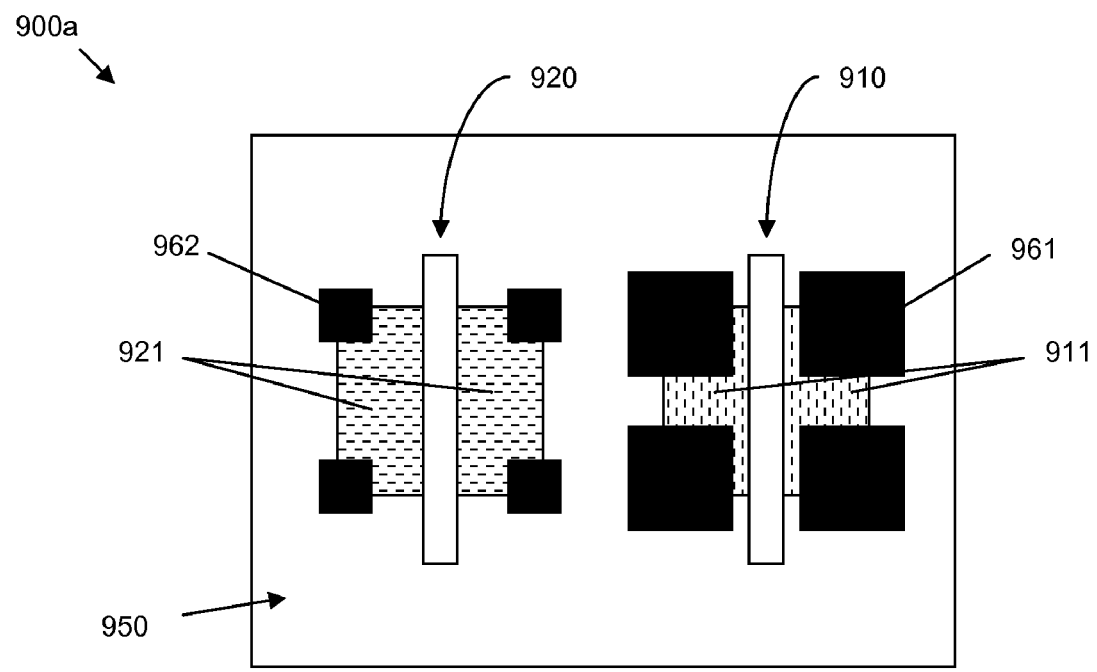
FIG. 9 is a schematic diagram illustrating an embodiment of the semiconductor structure of the invention.
Figure 10:
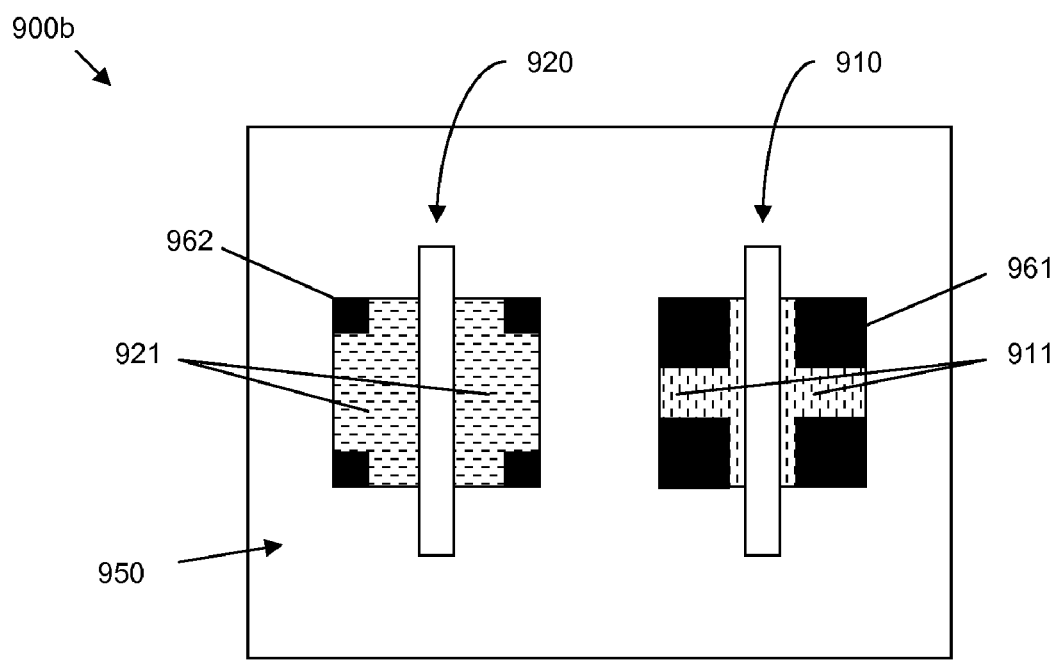
FIG. 10 is a schematic diagram illustrating an embodiment of the semiconductor structure of the invention

Referring to FIGS. 9-10, another embodiment the semiconductor structure 900a-b can also comprise at least two devices (i.e., a first device 910 and a second device 920) above the substrate of either a bulk silicon or silicon-on-insulator (SOI) wafer. These devices 910, 920 can comprise n-type field effect transistors (nFETs) and/or p-type field effect transistors (pFETs) and can be bordered by isolation regions 950 (e.g., shallow trench isolation structures (STIs)).

The structure 900a-b can further comprise a dielectric material (e.g., an oxide or a nitride) in first pattern 961 on the first device 910 and also in a second pattern 962 on the second device 920. These first and second patterns 961, 962 can be located only above the first device 910 and second device 920, respectively (as illustrated in structure 900b of FIG. 10), or can overlap the isolation regions 950 (as illustrated in structure 900a of FIG. 9).

The first density of the first pattern 961 (i.e., the relative amount of dielectric surface area of the first pattern 961 to semiconductor surface area of the first device 910 exposed) and the second density of the second pattern 962 (i.e., the relative amount of dielectric surface area of the second pattern 961 to semiconductor surface area of the second device 920 exposed) can be different and can be predetermined in order to selectively adjust the overall reflectivities of the first and second devices 910, 920 (i.e., to selectively adjust the overall reflectance characteristics of the first and second devices).

For example, the first density of the first pattern 961 and the second density of the second pattern 962 can each be predetermined in order to selectively and independently control the threshold voltages of the first and second devices 910, 920. As discussed above, if more of a device 910, 920 is covered by dielectric material, the reflectivity of the device will increase and, thus, the device will remain cooler during any subsequent rapid thermal anneal processes. Devices that remain cooler during anneal processes will have increased threshold voltages over other devices.

So, for example, the first and second devices 910, 920 might comprise FETs having the same material (e.g., silicon) in their respective source/drain regions 911, 921. A dielectric material patterned (see patterns 961 and 962) over each of these devices 910, 920 will ensure cooler anneal temperatures over similar devices without a patterned dielectric material. Thus, the threshold voltages of the devices 910, 920 will be higher than similar devices formed without the patterned dielectric material. Additionally, since the pattern 962 over the second device 920 is less dense than the pattern 961 over the first device 910, the first device 910 will have a cooler anneal temperature and, thus, a higher threshold voltage than the second device 920.

The first density of the first pattern 961 and the second density of the second pattern 962 can also each be predetermined in order to optimize anneal temperatures of the devices 910 and 920 (e.g., to optimize the anneal temperatures of pFETs and nFETs, as discussed above) and/or to balance differences in the reflectance characteristics of the devices (e.g., differences in the reflectance characteristics of nFETs with Si source/drain regions and pFETs with eSiGe source/drain regions, as discussed above).

Thus, it may be advantageous to provide a structure with increased reflectivity in both devices 910, 920, but not necessarily the same increase. For example, the first device 910 might comprise a p-type field effect transistor and the second device 920 might comprise an n-type field effect transistor. By patterning the dielectric material over both the pFET 910 and the nFET 920, cooler anneal temperatures for both devices can be achieved. However, since pFETs typically have a cooler optimal anneal temperature than nFETs, the density of the first patterns 961 can be greater than the density of the second pattern 962 in order to achieve the different optimal anneal temperatures. Additionally, the first device 910 might comprise a pFET with epitaxially grown silicon germanium source/drain regions 911 and the second device 920 might comprise an nFET with silicon source/drain regions 921. Again, by patterning the dielectric material on both devices 910, 920, cooler anneal temperatures can be achieved. However, since silicon germanium has less reflectivity then silicon, the density of the first pattern 961 will be greater than the density of the second pattern 962 in order to achieve a uniform reflectivity and greater still to achieve the different optimal anneal temperatures.

As with the previously described embodiment, the dielectric material must have a predetermined thickness that ensures a reflectance difference between the areas of the first device with and without the dielectric layer and the areas of the second device with and without the dielectric layer. Additionally, the thickness of the dielectric material can be predetermined in order to maximize the reflectance differences between these areas.

Figure 11:
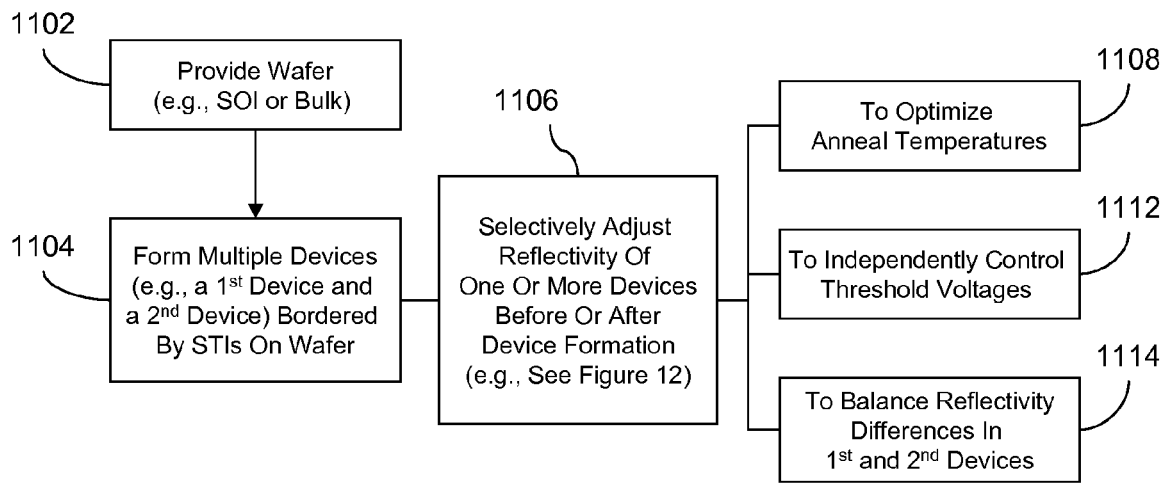
FIG. 11 is a flow diagram illustrating an embodiment of the method of forming the semiconductor structures of FIGS. 7-10.

Referring to FIG. 11 in combination with FIGS. 7-10, embodiments of the method of forming the second semiconductor structures 700a-b, 900a-b, discussed above, with one or more devices that have selectively adjusted reflectance and absorption characteristics can comprise first providing semiconductor wafer (e.g., a bulk silicon wafer or a silicon-on-insulator (SOI) wafer) (1102).

Multiple devices (e.g., a first device 710, 910 and a second device 710, 920) bordered by isolation regions 750, 950 (e.g., shallow trench isolation structures (STIs)) are formed on the wafer using conventional processing techniques (1104). Depending upon these processing techniques, the reflectivity of one or more of the devices (e.g., the first device 710, 910 and/or the second device 720, 920) is selectively adjusted (1106) either before or after formation, in order to adjust the maximum temperature that will be achieved in different regions (i.e., at different devices) during a RTA and, thereby, to optimize anneal temperatures (1108), independently control threshold voltages (1112) and/or to balance overall reflectivity differences between the first and second devices (1114).

Figure 12:
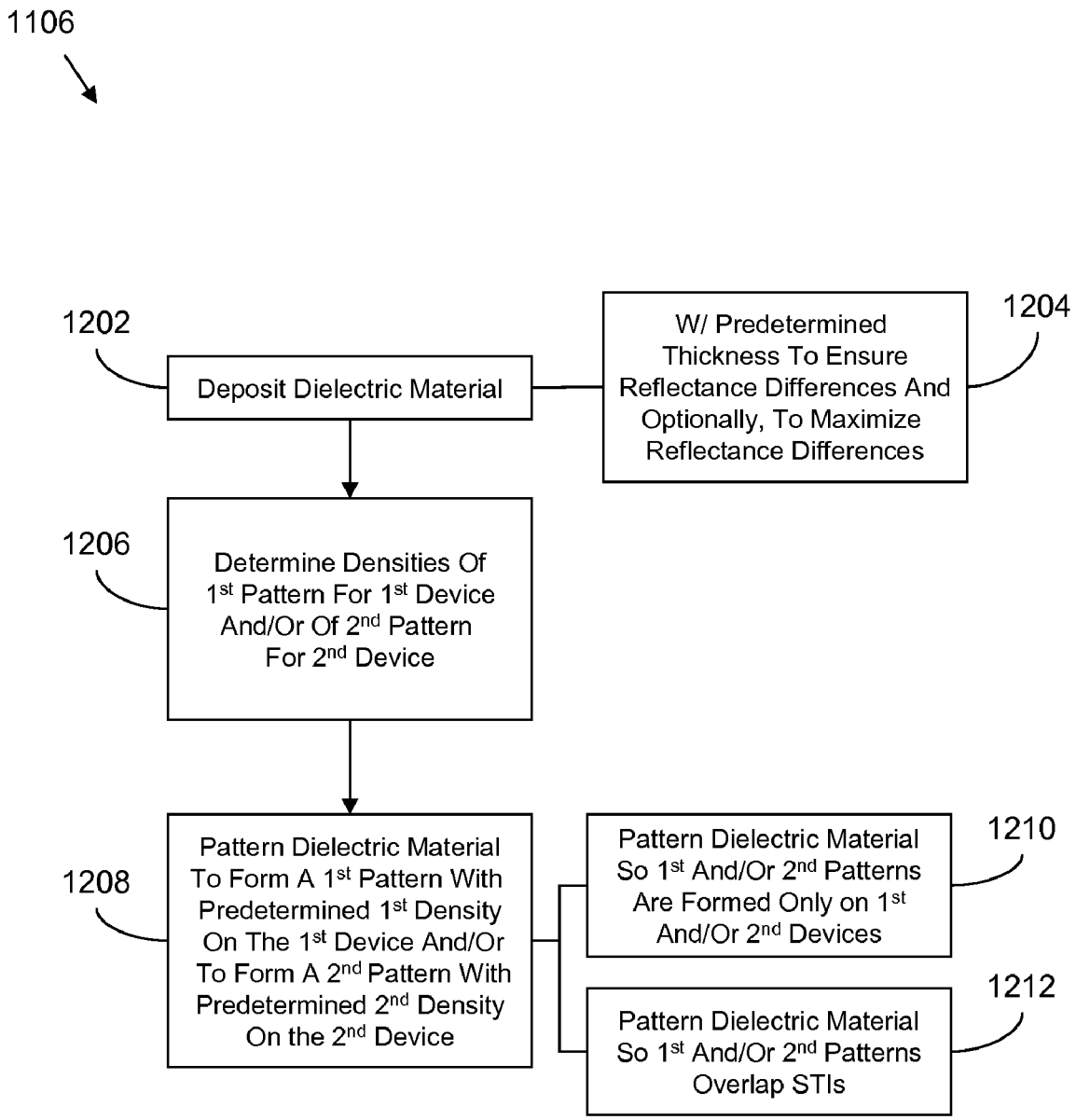
FIG. 12 is a flow diagram illustrating techniques method step 1106 of FIG. 10.

Referring to FIG. 12, in order to selectively adjust reflectivity at process 1106, a dielectric material (e.g., an oxide, such as, $SiO_2$, or a nitride, such as, SiN) is deposited over the devices (i.e., over the first 710, 910 and second 720, 920 devices) (1202) and patterned into a first pattern over the first device and/or a second pattern over the second device (1208). More particularly, the dielectric material is formed on the wafer (e.g., deposited and etched) so that it has a predetermined thickness (1202-1204). The predetermined thickness ensures a reflectance difference between the areas of the device(s) with and without the dielectric layer. Optionally, the thickness of the dielectric material can further be predetermined in order to maximize the reflectance difference between these areas.

Additionally, the first density of the first pattern and/or the second density of the second pattern are predetermined (1206). The predetermined densities of the first and second pattern will vary depending upon whether the goal is to selectively optimize the anneal temperatures of the first and second devices, to selectively and independently control threshold voltages of the first and second devices or to balance reflectivity differences between different semiconductor materials in the first device and the second device (see discussion above). The dielectric material is then patterned (e.g., using, for example, a conventional lithographic patterning process) to form the first pattern of dielectric material on the first device, optionally overlapping the adjacent isolation structures, and/or the second pattern of dielectric material on the second device, optionally overlapping the adjacent isolation structures (1208). Thus, the patterns are localized for individual device control.

After the dielectric material is patterned, a rapid thermal anneal (RTA) process (e.g., a laser anneal) can be performed in order to activate device dopants. A benefit of forming the semiconductor structure 700a-b and 900a-b in the manner described above and illustrated in FIGS. 11-12, is that the patterned dielectric material can be considered sacrificial. Thus, following the RTA, the dielectric material can be removed and device processing can continue.

Therefore, disclosed above are embodiments of a semiconductor structure and an associated method of forming the semiconductor structure with shallow trench isolation structures having selectively adjusted reflectance and absorption characteristics in order to ensure uniform temperature changes across a wafer during a rapid thermal anneal and, thereby, limit variations in device performance. Also disclosed are embodiments of another semiconductor structure and an associated method of forming the semiconductor structure with devices having selectively adjusted reflectance and absorption characteristics in order to selectively adjust the maximum temperature that will be achieved by those regions during a single RTA process and, thereby, to selectively vary the performance of individual devices (e.g., to form devices with different threshold voltages (Vt) on the same wafer or to ensure all devices have the same threshold voltages) and/or to selectively optimize the anneal temperature of individual devices (e.g., to ensure optimal activation temperatures for n-type and p-type dopants during anneals).

It should be noted that the inventors of the above embodiments have invented the following additional inventions related to the reflectance and absorption characteristics of wafers during rapid thermal anneals, each of which is being filed simultaneously herewith and is fully incorporated herein by reference: (1) co-filed U.S. patent application Ser. No. 11/678,756, titled "Semiconductor Wafer Structure With Balanced Reflectance And Absorption Characteristics For Rapid Thermal Anneal Uniformity", (2) co-filed U.S. patent application Ser. No. 11/678,745, titled "Structure And Method For Device-Specific Fill For Improved Anneal Uniformity", and (3) co-filed U.S. patent application Ser. No. 11/678,799, titled "Localized Temperature Control During Rapid Thermal Anneal".

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A semiconductor structure comprising:
   a substrate;
   a device above said substrate, wherein said device comprises a first material with a first reflectivity; and
   a trench isolation region above said substrate and positioned laterally adjacent to said device, wherein said trench isolation region comprises:
      a trench having sidewalls;
      a second material with a second reflectivity in said trench; and
      a third material with a third reflectivity in contact with said second material,
         wherein said third material does not extend laterally beyond said sidewalls, and
         wherein a location of said third material relative to said second material and a ratio of an amount of said third material to an amount of said second material are predetermined such that said third material balances differences between said first reflectivity of said first material of said device and said second reflectivity of said second material of said trench isolation region in order to make reflectance and absorption characteristics of said device and said trench isolation region approximately uniform.

2. The semiconductor structure of claim 1, wherein said third material is completely embedded within said second material such that said second material surrounds said third material on all sides.

3. The semiconductor structure of claim 1, wherein said third material is above said second material and not said first material.

4. The semiconductor structure of claim 1, wherein said third material is partially embedded within said second material such that a first portion of said third material is positioned within an upper one-half only of said trench and a second portion of said third material is above said second material.

5. The semiconductor structure of claim 1, wherein said substrate comprises one of a bulk semiconductor substrate and an insulator layer on a semiconductor substrate.

6. The semiconductor structure of claim 1, wherein said first material comprises a semiconductor, said second material comprises an insulator, and said third material comprises at least one of a second insulator and a spin-on dielectric material.

7. A semiconductor structure comprising:
   a substrate;
   a first device above said substrate;
   a second device above said substrate adjacent to said first device; and
   a dielectric material in a pattern on said first device and not on said second device,
      wherein an amount of said first device covered by said pattern is predetermined so as to selectively adjust a first reflectivity of said first device relative to a second reflectivity of said second device.

8. The semiconductor structure of claim 7, wherein said dielectric material comprises one of an oxide and a nitride.

9. The semiconductor wafer structure of claim 7, where a thickness of said dielectric material is predetermined so that a reflectance difference is exhibited between areas of said first device with and without said dielectric material.

10. The semiconductor structure of claim 7, wherein said first device is bordered by isolation regions and wherein said pattern overlaps both said first device and said isolation regions.

11. The semiconductor structure of claim 7, wherein said second device is essentially identical to said first device and wherein said amount of said first device covered by said pattern is predetermined in order to selectively increase said first reflectivity of said first device relative to said second reflectivity of said second device and to, thereby, selectively increase a first threshold voltage of said first device relative to a second threshold voltage of said second device.

12. The semiconductor structure of claim 7, wherein said first device comprises a p-type field effect transistor and said second device comprises an n-type field effect transistor and wherein said amount of said first device covered by said pattern is predetermined such that a first maximum temperature achievable by said p-type field effect transistor is less than a second maximum temperature achievable by said n-type field effect transistor during a rapid thermal anneal process.

13. The semiconductor structure of claim 7, wherein said first device comprises a first semiconductor material and said second device comprises a second semiconductor material, wherein said first semiconductor material and said second semiconductor material have different reflectivities and wherein said amount of said first device covered by said pattern is predetermined so as to balance said different reflectivities in order to make reflectance and absorption characteristics of said first device and said second approximately uniform.

14. The semiconductor structure of claim 13, wherein said first semiconductor material comprises silicon germanium and said second semiconductor material comprises silicon.

15. A semiconductor structure comprising:
   a substrate;
   a first device above said substrate;
   a second device above said substrate adjacent to said first device,
   a dielectric material in a first pattern on said first device and in a second pattern different from said first pattern on said second device, wherein a first amount of said first device covered by said first pattern and a second amount of said second device covered by said second pattern are different and are predetermined so that reflectivities of said first device and said second device are selectively adjusted.

16. The semiconductor structure of claim 15, wherein said dielectric material comprises one of an oxide and or a nitride.

17. The semiconductor structure of claim 15, where a thickness of said dielectric material is predetermined so that reflectance differences are exhibited between areas of said first device and said second device with and without said dielectric material, respectively.

18. The semiconductor structure of claim 15, wherein said second device is essentially identical to said first device, wherein said first amount and said second amount are each independently predetermined in order to selectively and independently control threshold voltages of said first device and said second device, and wherein said first amount is greater than said second amount such that a first threshold voltage of said first device is greater than a second threshold voltage of said second device.

19. The semiconductor structure of claim 15, wherein said first device comprises a p-type field effect transistor and said second device comprises an n-type field effect transistor, wherein said first amount and said second amount are predetermined in order to selectively and independently control maximum temperatures achievable by said first device and said second device during a rapid thermal anneal process, wherein said first amount is greater than said second amount such that a first maximum temperature achievable by said p-type field effect transistor is less than a second maximum temperature achievable by said n-type field effect transistor during a rapid thermal anneal process.

20. The semiconductor structure of claim 15, wherein said first device and said second device are bordered by isolation regions and wherein said first pattern and said second pattern overlap said isolation regions.

* * * * *